United States Patent
Khachatryan

(10) Patent No.: US 9,246,124 B2
(45) Date of Patent: Jan. 26, 2016

(54) CARRIER FOR FLEXIBLE SUBSTRATE, SUBSTRATE PROCESSING APPARATUS INCLUDING THE CARRIER, AND METHOD OF MANUFACTURING FLEXIBLE DISPLAY APPARATUS

(71) Applicant: SAMSUNG DISPLAY CO., LTD., Yongin, Gyeonggi-Do (KR)

(72) Inventor: Hayk Khachatryan, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 233 days.

(21) Appl. No.: 14/089,537

(22) Filed: Nov. 25, 2013

(65) Prior Publication Data

US 2014/0377939 A1  Dec. 25, 2014

(30) Foreign Application Priority Data

Jun. 19, 2013  (KR) .................. 10-2013-0070494

(51) Int. Cl.
| | | |
|---|---|---|
| H01L 21/00 | (2006.01) | |
| H01L 51/52 | (2006.01) | |
| G02F 1/1333 | (2006.01) | |
| H01L 51/00 | (2006.01) | |

(52) U.S. Cl.
CPC ........ *H01L 51/524* (2013.01); *G02F 1/133305* (2013.01); *G02F 1/133351* (2013.01); *H01L 51/0097* (2013.01)

(58) Field of Classification Search
CPC .......................... H01L 51/0097; H01L 51/524
USPC ..................................... 438/26, 33
See application file for complete search history.

(56) References Cited

U.S. PATENT DOCUMENTS

| | | | |
|---|---|---|---|
| 4,247,349 A | 1/1981 | Detert et al. | |
| 4,599,847 A | 7/1986 | Reenstra | |
| 5,001,956 A | 3/1991 | Nitsch | |
| 8,003,184 B2 | 8/2011 | Ugolick | |
| 8,256,334 B2 | 9/2012 | Lin | |
| 2007/0207594 A1* | 9/2007 | Tamura ............. | B23K 26/0057 438/463 |
| 2008/0002137 A1* | 1/2008 | Kim ..................... | G02F 1/1341 349/187 |
| 2012/0228617 A1 | 9/2012 | Ko et al. | |

* cited by examiner

FOREIGN PATENT DOCUMENTS

| | | |
|---|---|---|
| KR | 10-2012-0054391 | 5/2012 |
| WO | WO 2009/061310 A1 | 5/2009 |

OTHER PUBLICATIONS

Haq, Jesmin et al., "Temporary bond-debond technology for high-performance transistors on flexible substrates", Journal of the Society for Information Display, (2010), pp. 884-891.

*Primary Examiner* — Bradley K Smith
(74) *Attorney, Agent, or Firm* — Christie, Parker & Hale, LLP

(57) ABSTRACT

Provided is a carrier for a flexible substrate which is capable of handling a flexible substrate during a flexible substrate processing process, while allowing the flexible substrate to be easily separated. Also provided is a substrate processing apparatus, including the carrier, and a method of manufacturing a flexible display apparatus. The carrier includes a substrate supporting portion having a top surface including a mounting surface, an outer circumferential surface, surrounding the mounting surface, and a first heat cutting portion. The first heat cutting portion is located outside the mounting surface so as to be exposed on the top surface and generates heat when a current flows through the first heat cutting portion.

10 Claims, 5 Drawing Sheets

CARRIER FOR FLEXIBLE SUBSTRATE, SUBSTRATE PROCESSING APPARATUS INCLUDING THE CARRIER, AND METHOD OF MANUFACTURING FLEXIBLE DISPLAY APPARATUS

CROSS-REFERENCE TO RELATED APPLICATION

This application claims priority to and the benefit of Korean Patent Application No. 10-2013-0070494, filed on Jun. 19, 2013, in the Korean Intellectual Property Office, the disclosure of which is incorporated herein in its entirety by reference.

BACKGROUND

1. Field

Embodiments of the present invention relate to a carrier for a flexible substrate, which is capable of easily handling a flexible substrate during a flexible substrate processing process while enabling the flexible substrate to be easily separated, a substrate processing apparatus including the carrier, and a method of manufacturing a flexible display apparatus.

2. Description of the Related Art

Due to recent interest in flexible displays, research regarding flexible displays is being actively conducted. In order to realize flexible displays, a flexible substrate formed of resin is used, instead of a conventional glass substrate. When a flexible display apparatus, such as an organic light emitting display apparatus, is to be manufactured, a thin film transistor (TFT) and/or an organic light emitting device are formed on a flexible substrate.

SUMMARY

Embodiments of the present invention provide a carrier for a flexible substrate, which is capable of easily handling the flexible substrate during a flexible substrate processing process while enabling the flexible substrate to be easily separated, a substrate processing apparatus including the carrier, and a method of manufacturing a flexible display apparatus.

According to an embodiment of the present invention, there is provided a carrier for a flexible substrate. The carrier includes a substrate supporting portion having a top surface including a mounting surface, on which a portion of a flexible substrate is to be mounted, an outer circumferential surface surrounding the mounting surface, and a first heat cutting portion located outside the mounting surface. The first heat cutting portion may be exposed on the top surface and configured to generate heat when a current flows through the first heat cutting portion.

The top surface may be flat throughout the mounting surface and the outer circumferential surface. The first heat cutting portion may be a thin film line. The substrate supporting portion may have a first groove in a portion of the outer circumferential surface near the mounting surface. The first heat cutting portion may be located in the first groove so as to be exposed on the top surface.

The first heat cutting portion may surround the mounting surface such that a portion of the mounting surface is opened. An electric connection terminal may be located at each end of the first heat cutting portion. The first heat cutting portion may include molybdenum disilicide. The substrate supporting portion may include glass-ceramic.

According to another embodiment of the present invention, there is provided a flexible substrate processing apparatus. The flexible substrate processing apparatus includes at least one carrier, as described above, and a flexible substrate separating cover. The flexible substrate separating cover includes a cover body. The cover body may have an accommodation surface, a supporting surface, and a second heat cutting portion. The accommodation surface may correspond to the mounting surface. The supporting surface may correspond to the outer circumferential surface and protrude further than the accommodation surface.

The second heat cutting portion may be located at the supporting surface and configured to generate heat when a current flows through the second heat cutting portion. When the flexible substrate separating cover is located on a flexible substrate mounted in the substrate supporting portion, a location of the second heat cutting portion may correspond to a location of the first heat cutting portion.

The second heat cutting portion may be a thin film line. The flexible substrate separating cover may have a second groove in a portion of the supporting surface near the accommodation surface. The second heat cutting portion may be located in the second groove so as to be exposed on the supporting surface.

The second heat cutting portion may surround the accommodation surface of the cover body such that a portion of the accommodation surface is opened. The second heat cutting portion may include molybdenum disilicide.

The flexible substrate separating cover may include a flexible substrate suction portion located at the accommodation surface of the cover body.

According to another embodiment of the present invention, there is provided a flexible substrate processing apparatus. The flexible substrate processing apparatus includes at least one carrier, as described above, and a flexible substrate separating cover. The flexible substrate separating cover includes a cover body. The cover body may have an accommodation surface, a supporting surface, and a substrate protector. The accommodation surface may correspond to the mounting surface. The supporting surface may correspond to the outer circumferential surface and protrude further than the accommodation surface. The substrate protector may be located at a portion of the accommodation surface adjacent to the supporting surface. The substrate protector may contact a flexible substrate when the flexible substrate separating cover is located on a flexible substrate mounted on the substrate supporting portion.

The substrate protector may protrude further than the accommodation surface and the supporting surface of the cover body so that only the substrate protector contacts the flexible substrate when the flexible substrate separating cover is located on a flexible substrate mounted on the substrate supporting portion.

According to another embodiment of the present invention, there is provided a method of manufacturing a flexible display apparatus including: disposing a flexible substrate over a mounting surface and an outer circumferential surface of at least one carrier for a flexible substrate, as described above; and separating a portion of the flexible substrate from a remaining portion by applying a current to the first heat cutting portion.

The disposing of the flexible substrate may include coating polyimide over the mounting surface and the outer circumferential surface.

The disposing of the flexible substrate may include forming a transparent flexible substrate by coating polyimide over the mounting surface and the outer circumferential surface.

The method may further include forming and crystallizing an amorphous silicon layer on the flexible substrate.

The method may further include coating polyimide over the mounting surface and the outer circumferential surface.

The method may further include forming the flexible substrate by coating polyimide over the mounting surface and the outer circumferential surface.

The method may further include forming and crystallizing an amorphous silicon layer on the flexible substrate.

The method may further include the top surface being substantially flat throughout the mounting surface and the outer circumferential surface and the first heat cutting portion being a thin film line.

The method may further include the substrate supporting portion having a groove in a portion of the outer circumferential surface near the mounting surface and the first heat cutting portion being located in the groove so as to be exposed on the top surface.

The method may further include the first heat cutting portion surrounding the mounting surface such that a portion of the mounting surface is opened.

The method may further include an electric connection terminal being located at each end of the first heat cutting portion.

The method may further include the first heat cutting portion being made of molybdenum disilicide.

The method may further include the substrate supporting portion being made of glass-ceramic.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
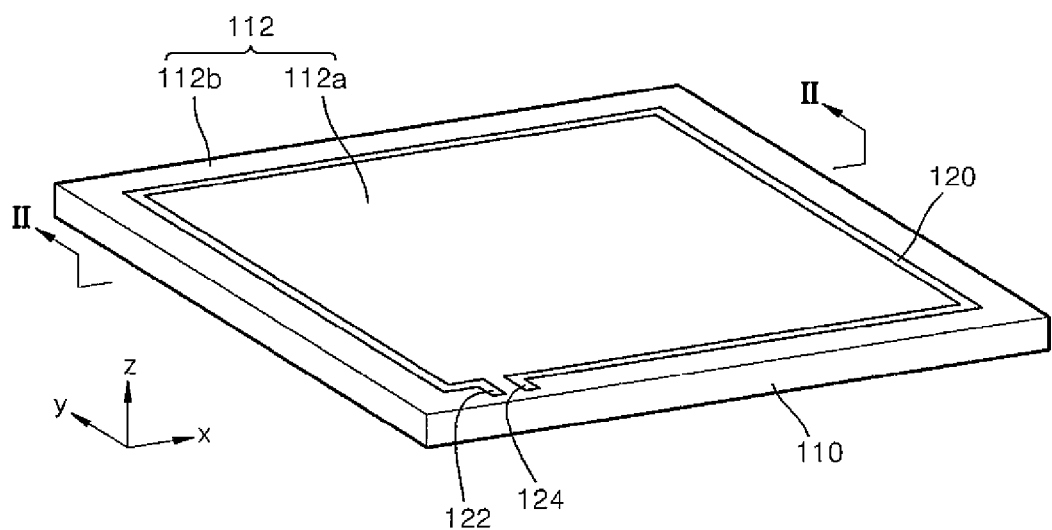
FIG. 1 is a schematic perspective view of a carrier for a flexible substrate, according to an embodiment of the present invention.

Since the flexible substrate is used in a flexible display apparatus, it is difficult to handle the flexible substrate during a manufacturing process. For example, when the flexible display apparatus is manufactured, pixels, such as TFTs or organic light emitting devices, are formed on the flexible substrate. Misalignment may occur during a photolithography process or a mask process due to a flexible characteristic of the flexible substrate, and thus manufacturing defects may be easily generated.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements, and the sizes and thicknesses of layers and regions are exaggerated for clarity.

In one or more embodiments of the present invention, x-, y-, and z-axes are not limited to the three axes on an orthogonal coordinates system, and may be interpreted to have a wider meaning. For example, the x-, y-, and z-axes may cross each other at right angles, or may denote other directions that do not cross each other at right angles.

It will also be understood that when a layer is referred to as being "on" another layer or substrate, it can be directly on the other layer or substrate, or intervening layers may also be present.

As used herein, the term "and/or" includes any and all combinations of one or more of the associated listed items.

Figure 2:
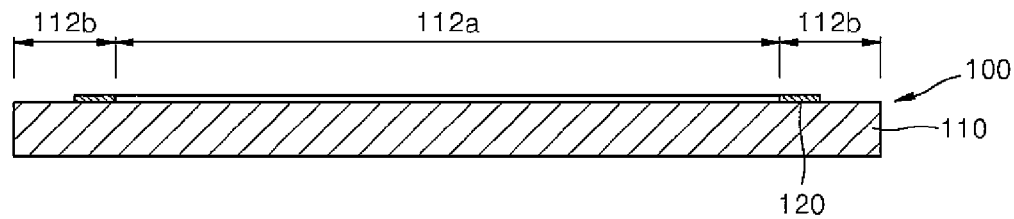
FIG. 2 is a cross-sectional view taken along the line II-II of FIG. 2.

FIG. 1 is a schematic perspective view of a carrier for a flexible substrate, according to an embodiment of the present invention, and FIG. 2 is a cross-sectional view taken along the line II-II of FIG. 2.

A carrier 100 according to the current embodiment includes a substrate supporting portion 110 and a first heat cutting portion 120.

The substrate supporting portion 110 has a top surface 112 in an +z direction, wherein the top surface 112 includes a mounting surface 112a on which a portion of a flexible substrate is to be mounted, and an outer circumferential surface 112b surrounding the mounting surface 112a. Since the substrate supporting portion 110 is sufficiently thicker than the flexible substrate to be mounted, the flexible substrate may not bend or be deformed when the flexible substrate is processed. For example, the substrate supporting portion 110 may include glass-ceramic. The substrate supporting portion 110 may be formed of a glass material, but in this case, the substrate supporting portion 110 may break or crack due to repeated use. However, since glass-ceramic has excellent heat resistance and strength, deformation or damage of the glass-ceramic may be reduced despite repeated use. In particular, since the carrier 100 according to the current embodiment is used not once but a plurality of times, the substrate supporting portion 110 may include glass-ceramic.

The first heat cutting portion 120 is located outside the mounting surface 112a of the top surface 112 of the substrate supporting portion 110, and is exposed on the top surface 112 of the substrate supporting portion 110. The first heat cutting portion 120 may generate heat when a current is applied (e.g. a current flows there through). In other words, the first heat cutting portion 120 may have sufficient resistance to generate Joule heat when a current flows there through. The first heat cutting portion 120 may include electric connection terminals 122 and 124 at each end as shown in FIG. 1 so that a current flows through the first heat cutting portion 120. In other words, when an electric signal is applied to the electric connection terminals 122 and 124, Joule heat may be generated as the current flows through the first heat cutting portion 120.

The first heat cutting portion 120 may surround the mounting surface 112a of the substrate supporting portion 110 as shown in FIG. 1, such that a portion of the mounting surface 112a is opened. In other words, in order to effectively generate a potential difference in the first heat cutting portion 120 so that the current flows through the first heat cutting portion 120 to generate heat, the first heat cutting portion 120 may not form a closed loop surrounding the mounting surface 112a of the substrate supporting portion 110, but may surround the mounting surface 112a such that the portion of the mounting surface 112a is opened.

The top surface 112 of the substrate supporting portion 110 may be flat throughout the mounting surface 112a and the outer circumferential surface 112b, and the first heat cutting portion 120 may be a thin film line. In other words, the first heat cutting portion 120 may be very flat and formed on the top surface 112 of the substrate supporting portion 110 so that the top surface 112 and the first heat cutting portion 120 appear to be macroscopically almost flat. A thickness of the first heat cutting portion 120, i.e., a height protruding from the top surface 112, may be less than or equal to about 9 um, because if the first heat cutting portion 120 protrudes considerably from the top surface 112, a defect may be generated while forming the flexible substrate or processing the flexible substrate as described below.

In order to form the first heat cutting portion 120 so that it: has a shape of the thin film line, generates sufficient Joule heat when a current flows, and has excellent corrosion resistance or oxidation resistance ensuring it is not easily chemically corroded or oxidized, the first heat cutting portion 120 may include molybdenum disilicide ($MoSi_2$), In particular, when a difference between a coefficient of thermal expansion of a material included in the first heat cutting portion 120 and a coefficient of thermal expansion of a material included in the substrate supporting portion 110 is high, the first heat cutting portion 120 may be detached from the substrate supporting portion 110 in an environment of a high temperature while processing the flexible substrate. However, since a difference between a coefficient of thermal expansion of molybdenum disilicide and a coefficient of thermal expansion of glass-ceramic or glass is not high, the first heat cutting portion 120 may include $MoSi_2$.

The first heat cutting portion 120 including $MoSi_2$ may be formed on the substrate supporting portion 110 via a deposition method, such as physical vapor deposition (PVD) or chemical vapor deposition (CVD). Alternatively, if required, the first heat cutting portion 120 may be formed via a low-priced painting method.

Alternatively, the first heat cutting portion 120 may include aluminum-doped molybdenum disilicide, aside from molybdenum disilicide, or may include kanthal, nichrome, and/or cupronickel.

Figure 3:
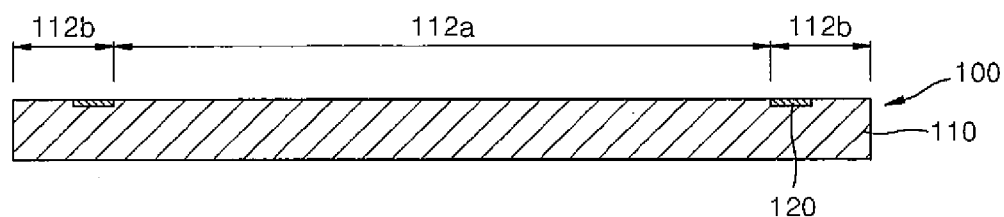
FIG. 3 is a cross-sectional view of a carrier for a flexible substrate, according to an embodiment of the present invention.

FIG. 3 is a cross-sectional view of a carrier for a flexible substrate, according to an embodiment of the present invention. Unlike FIG. 2, the substrate supporting portion 110 may include a groove in a portion of the outer circumferential surface 112b near the mounting surface 112a, and the first heat cutting portion 120 may be located in the groove of the substrate supporting portion 110 such that the first heat cutting portion 120 is exposed on the top surface 112 of the substrate supporting portion 110. As such, the top surface 112 and the first heat cutting portion 120 may form a further overall flat surface.

Figure 4:
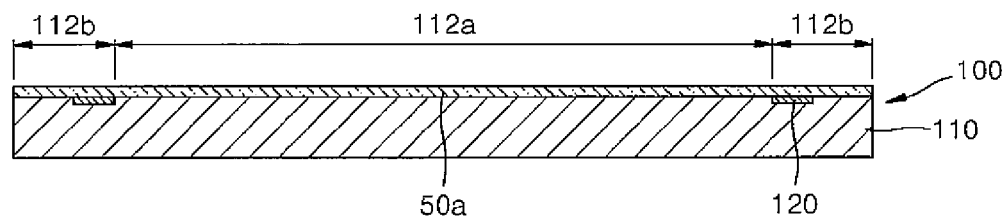
FIGS. 4 and 5 are cross-sectional views for describing flexible substrate processing processes using the carrier of FIG. 3, according to an embodiment of the present invention.
Figure 5:
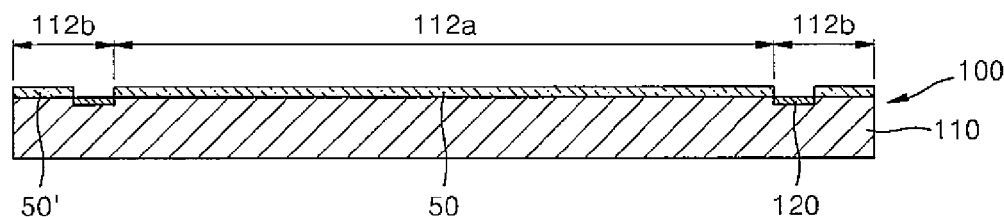

FIGS. 4 and 5 are cross-sectional views for describing flexible substrate processing processes using the carrier 100 of FIG. 3, according to an embodiment of the present invention. Here, the carrier 100 shown in FIGS. 1 and 2 may also process a flexible substrate in the same/similar manner to that shown in FIGS. 4 and 5.

As shown in FIG. 4, a flexible substrate 50a is disposed (e.g. formed, positioned, or placed) over the mounting surface 112a and the outer circumferential surface 112b of the carrier 100. Here, a flexible substrate material may be coated and hardened over the mounting surface 112a and the outer circumferential surface 112b of the carrier 100. Examples of the flexible substrate material include polyimide, polyethylenenaphthalate, polyethyleneterephthalate, polyetheretherketone, polyethersulfone, polymethylmethacrylate, polycarbonate, and polypropylene. For example, when polyimide is used, the flexible substrate 50a may be formed by using transparent polyimide.

Here, before disposing (e.g. forming, positioning, or placing) the flexible substrate 50a over the mounting surface 112a and the outer circumferential surface 112b of the carrier 100, the mounting surface 112a may be surface-processed. As described below, a portion of the flexible substrate 50a on the mounting surface 112a is a final flexible substrate. Accordingly, the portion of the flexible substrate 50a on the mounting surface 112a is to be separated from the carrier 100 later, and for easy separation, the mounting surface 112a of the carrier 100 may be surface-processed.

The mounting surface 112a may be processed by using any one of various methods, and for example, a temporary bonding layer may be formed on the mounting surface 112a. In other words, before disposing (e.g. forming, positioning, or placing) the flexible substrate 50a over the mounting surface 112a and the outer circumferential surface 112b, the temporary bonding layer may be formed on the mounting surface 112a by using a material, such as polysiloxane. Here, polysiloxane is a material having a weak binding force with respect to a flexible substrate formed of, for example, polyimide, and the material of the temporary bonding layer is not limited as long as it has a weak binding force with respect to a flexible substrate.

As described above, when the mounting surface 112a of the carrier 100 is surface-processed, and then the flexible substrate material is coated and hardened over the mounting surface 112a and the outer circumferential surface 112b, a portion of the flexible substrate 50a corresponding to the mounting surface 112a is temporarily bonded to the mounting surface 112a, and a portion of the flexible substrate 50a corresponding to the outer circumferential surface 112b is permanently bonded to the outer circumferential surface 112b. Since the portion of the flexible substrate 50a corresponding to the outer circumferential surface 112b is permanently bonded to the outer circumferential surface 112b, the flexible substrate 50a is fixed on the carrier 100, and thus handling stability of the flexible substrate 50a may be obtained.

The flexible substrate 50a may be disposed (e.g. formed, positioned, or placed) over the mounting surface 112a and the outer circumferential surface 112b, and then the flexible substrate 50a may be processed. For example, an amorphous silicon layer may be formed and crystallized on the flexible substrate 50a. The amorphous silicon layer may be crystallized by using an excimer laser. In order to irradiate an excimer laser beam on an entire surface or portions (e.g. predetermined portions) of the amorphous silicon layer, a top surface of the amorphous silicon layer may be scanned by the excimer laser beam. At this time, the top surface of the amorphous silicon layer is formed to be flat so that the amorphous silicon layer is uniformly crystallized, and an excimer laser annealing apparatus is prevented from being damaged (by a collision or contact with the amorphous silicon layer). Accordingly, as described above, the top surface of the substrate supporting portion 110 of the carrier 100 and the first heat cutting portion 120 may appear to be macroscopically almost flat or substatially flat.

The flexible substrate 50a may be processed in another manner. For example, a pixel electrode and a common electrode, which face each other, and an intermediate layer including an emission layer may be formed. In this case, any one of various processes, such as a photolithography process or a mask process, may be performed if required. Here, since the portion of the flexible substrate 50a corresponding to the outer circumferential surface 112b is permanently bonded to the outer circumferential surface 112b, misalignment generated during a photolithography process or a mask process due to a flexible characteristic of the flexible substrate 50a may be effectively prevented.

Next, a current flows through the first heat cutting portion 120 so that the portion of the flexible substrate 50a on the mounting surface 112a is separated from a remaining portion. In other words, when the current flows through the first heat cutting portion 120, at least a portion of the flexible substrate 50a on the first heat cutting portion 120 is melted or further evaporated, such that, as shown in FIG. 5, a portion 50 of the flexible substrate 50a on the mounting surface 112a is separated from a remaining portion 50'. Here, since the portion 50 of the flexible substrate 50a on the mounting surface 112a is temporarily bonded on the mounting surface 112a, the portion 50 may be easily separated from the carrier 100. Accordingly, the portion 50 of the flexible substrate 50a on which a required process has been performed, or a structure including the portion 50, may be obtained.

When polyethylenenaphthalate is used as the flexible substrate material, a melting point is about 155° C., when polyethyleneterephthalate is used, a melting point is about 260° C., when polyetheretherketone is used, a melting point is about 143° C., when polyethersulfone is used, a melting point is about 300° C., when polymethylmethacrylate is used, a melting point is about 160° C., when polycarbonate is used, a melting point is about 147° C., and when polyimide is used, a melting point is about 260° C. Accordingly, when the first heat cutting portion 120 is equal to or greater than the above temperature, the portion 50 of the flexible substrate 50a on the mounting surface 112a may be separated from the remaining portion 50'. When the first heat cutting portion 120 includes, for example, molybdenum disilicide, molybdenum disilicide may emit Joule heat up to about 1800° C., and thus a high temperature sufficient to cut the flexible substrate 50a may be applied to the flexible substrate 50a. For example, when a current of about 140 A flows through the first heat cutting portion 120 while a potential difference between both ends is in a range of about 6 to 7 V, a temperature of the first heat cutting portion 120 may increase up to about 1700° C.

Since the remaining portion 50' of the flexible substrate 50a on the outer circumferential surface 112b of the carrier 100 is permanently bonded on the outer circumferential surface 112b, the remaining portion 50' may be removed before reusing the carrier 100.

Figure 6:
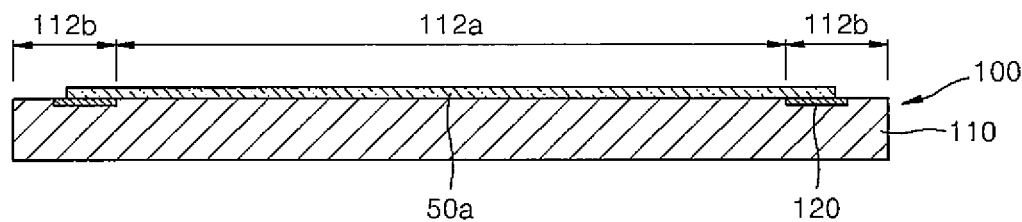
FIGS. 6 and 7 are cross-sectional views for describing flexible substrate processing processes using a carrier for a flexible substrate, according to another embodiment of the present invention.
Figure 7:
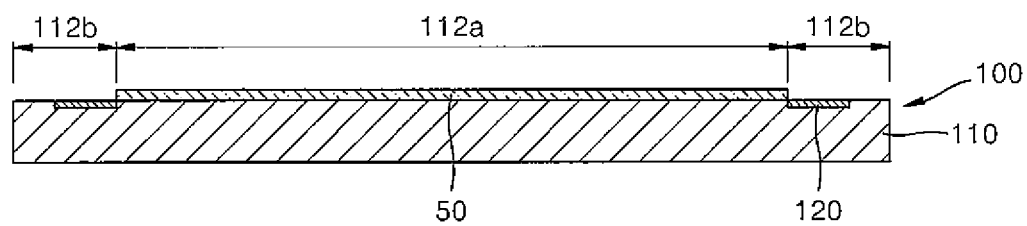

FIGS. 6 and 7 are cross-sectional views for describing flexible substrate processing processes using the carrier 100 for a flexible substrate, according to another embodiment of the present invention. As shown in FIGS. 6 and 7, the first heat cutting portion 120 may have a sufficient area. In this case, when the flexible substrate 50a is disposed (e.g. formed, positioned, or placed) over the mounting surface 112a and the outer circumferential surface 112b of the carrier 100, a portion of the flexible substrate 50a on the outer circumferential surface 112b may be located only on the first heat cutting portion 120 as shown in FIG. 6. In this case, when a current flows through the first heat cutting portion 120 after the flexible substrate 50a is processed, only the portion 50 of the flexible substrate 50a on the mounting surface 112a may remain on the carrier 100 and there is no remainder of the flexible substrate 50a on the carrier 100 as shown in FIG. 7. Accordingly, the carrier 100 may be easily reused.

Figure 8:
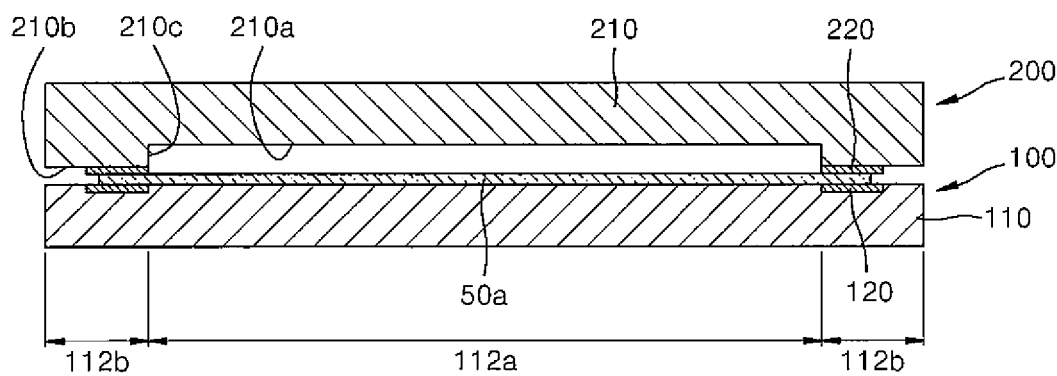
FIG. 8 is a cross-sectional view for describing a flexible substrate processing process using a substrate processing apparatus, according to an embodiment of the present invention.

FIG. 8 is a cross-sectional view for describing a flexible substrate processing process using a substrate processing apparatus, according to an embodiment of the present invention.

The substrate processing apparatus includes the carrier 100 according to any one of the above embodiments, and a flexible substrate separating cover 200. In FIG. 8, the carrier 100 of FIG. 3 is shown for convenience, but the current embodiment is not limited thereto, and the carrier 100 according to any one of the above embodiments or a modified example may be used. The same is applied to embodiments below and modified examples.

The flexible substrate separating cover 200 includes a cover body 210 and a second heat cutting portion 220.

The cover body 210 has an accommodation surface 210a corresponding to the mounting surface 112a of the substrate supporting portion 110, and a supporting surface 210b corresponding to the outer circumferential surface 112b of the substrate supporting portion 110 and protruding further than the accommodation surface 210a. Here, the cover body 210 may also include an inner surface 210c connecting the accommodation surface 210a and the supporting surface 210b. The cover body 210 may be formed of any one of various materials, such as a metal material or glass-ceramic.

The second heat cutting portion 220 is located on the supporting surface 210b of the cover body 210, and may generate heat when a current flows through the second heat cutting portion 220. The second heat cutting portion 220 may include the same/similar material as the first heat cutting portion 120. For example, the second heat cutting portion 220 may include molybdenum disilicide.

In addition, as shown in FIG. 8, the second heat cutting portion 220 may be a thin film line located on the supporting surface 210b of the cover body 210. Alternatively, the flexible substrate separating cover 200 may have a groove in a portion of the supporting surface 210b near the accommodation surface 210a, and the second heat cutting portion 220 may be located in the groove of the supporting surface 210b so as to be exposed on the supporting surface 210b.

As such, according to the substrate processing apparatus of the current embodiment, when the portion of the flexible substrate 50a on the mounting surface 112a of the carrier 100 is to be separated from the remaining portion, the first and second heat cutting portions 120 and 220 may concurrently (e.g. simultaneously) generate heat so that the flexible substrate 50a is smoothly separated. Accordingly, when the flexible substrate separating cover 200 is located on the flexible substrate 50a mounted on the substrate supporting portion 110, a location of the second heat cutting portion 220 may correspond to a location of the first heat cutting portion 120.

Meanwhile, like the first heat cutting portion 120, the second heat cutting portion 220 may surround the accommodation surface 210a of the cover body 210 such that a portion of the accommodation surface 210a is opened. In this case, the opened portion of the accommodation surface 210a and the opened portion of the mounting surface 112a may not correspond to each other. Accordingly, a portion of the flexible substrate 50a located at the opened portion of the accommodation surface 210a is melted or evaporated by the first heat cutting portion 120, and a portion of the flexible substrate 50a located at the opened portion of the mounting surface 112a is melted or evaporated by the second heat cutting portion 220, and thus the portion of the flexible substrate 50a on the mounting surface 112a may be effectively separated from the remaining portion.

Figure 9:
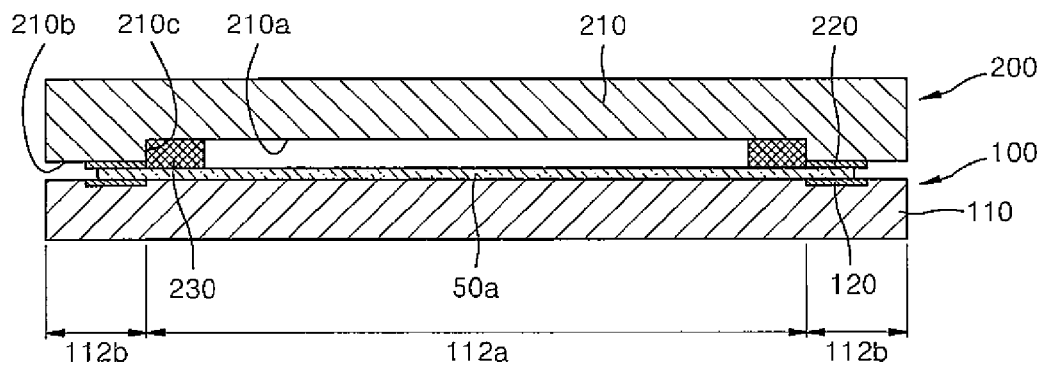
FIG. 9 is a cross-sectional view for describing a flexible substrate processing process using a substrate processing apparatus, according to another embodiment of the present invention.

FIG. 9 is a cross-sectional view for describing a flexible substrate processing process using a substrate processing apparatus, according to another embodiment of the present invention. A difference between the substrate processing apparatuses of FIGS. 8 and 9 is that the substrate processing apparatus of FIG. 9 according to the current embodiment includes a substrate protector 230 located on a portion of the accommodation surface 210a near the supporting surface 210b. The substrate protector 230 may include a metal. By using the substrate processing apparatus according to the current embodiment, when the flexible substrate separating cover 200 is located on the flexible substrate 50a mounted on the substrate supporting portion 110, the substrate protector 230 contacts the flexible substrate 50a.

When the first heat cutting portion 120 and/or the second heat cutting portion 220 cuts a portion of the flexible substrate 50a by using Joule heat, a portion of the flexible substrate 50a located at an edge of the mounting surface 112a may be damaged. However, by using the substrate processing apparatus according to the current embodiment, the substrate protector 230 covers the portion of the flexible substrate 50a located at the edge of the mounting surface 112a, and thus the portion of the flexible substrate 50a located at the edge of the mounting surface 112a may be prevented from being damaged. For example, the substrate protector 230 absorbs Joule heat emitted from the first heat cutting portion 120 and/or the second heat cutting portion 220, and thus a portion of the flexible substrate 50a located directly below the substrate protector 230 may be effectively prevented from being affected by Joule heat.

Figure 10:
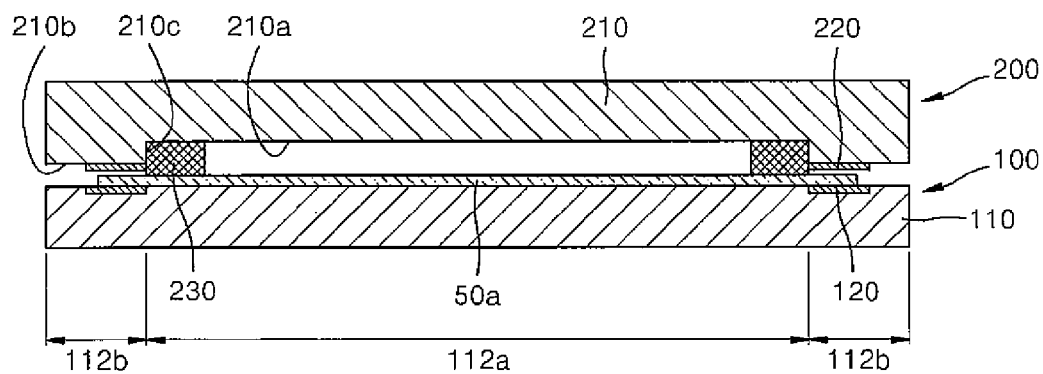
FIG. 10 is a cross-sectional view for describing a flexible substrate processing process using a substrate processing apparatus, according to another embodiment of the present invention.

In FIG. 9, a surface of the substrate protector 230 facing the carrier 100 matches a surface of the second heat cutting portion 220 facing the carrier 100, but an embodiment of the present invention is not limited thereto. For example, as shown in FIG. 10, which is a cross-sectional view for describing a flexible substrate processing process using a substrate processing apparatus, according to another embodiment of the present invention, the surface of the substrate protector 230 facing the carrier 100 may protrude further than the surface of the second heat cutting portion 220 facing the carrier 100.

Accordingly, a portion of the flexible substrate 50a may be cut by using Joule heat of the second heat cutting portion 220, while a portion of the flexible substrate 50a directly below the substrate protector 230 is prevented from being directly affected by Joule heat of the second heat cutting portion 220. As a result, the portion of the flexible substrate 50a located at the edge of the mounting surface 112a may be effectively prevented from being damaged or may be less damaged.

Figure 11:
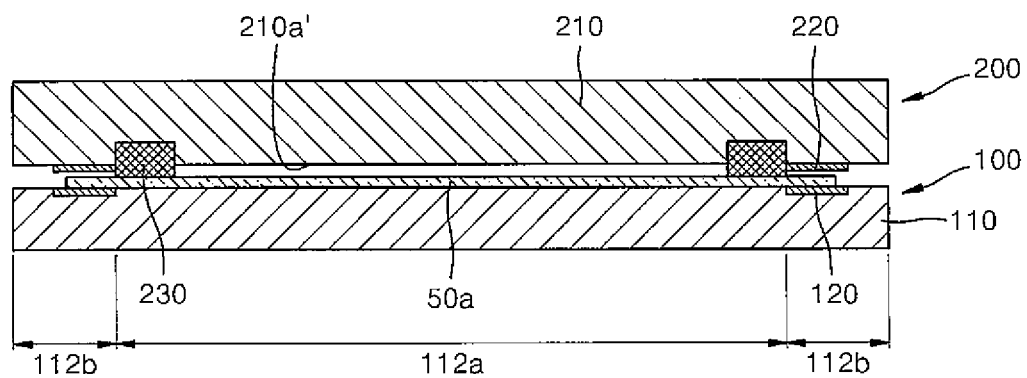
FIG. 11 is a cross-sectional view for describing a flexible substrate processing process using a substrate processing apparatus, according to another embodiment of the present invention.

However, the flexible substrate separating cover 200 may not necessarily include the accommodation surface 210a and the supporting surface 210b protruding from the accommodation surface 210a. FIG. 11 is a cross-sectional view for describing a flexible substrate processing process using a substrate processing apparatus, according to another embodiment of the present invention. As shown in FIG. 11, the cover body 210 may include an accommodation surface corresponding to the mounting surface 112a of the substrate supporting portion 110, and a supporting surface corresponding to the outer circumferential surface 112a of the substrate supporting portion 110, wherein the accommodation surface and the supporting surface are located on a same plane 210a'. In this case, the substrate protector 230 protrudes from the plane 210a', and thus the plane 210a' may not contact the flexible substrate 50a on the substrate supporting portion 110.

Meanwhile, in the embodiments described above with reference to FIGS. 9 through 11, when the flexible substrate separating cover 200 of the substrate processing apparatus includes the substrate protector 230, the flexible substrate separating cover 200 also includes the second heat cutting portion 220, but one or more embodiments of the present invention are not limited thereto. For example, the substrate processing apparatuses of FIGS. 9 through 11 may not include the second heat cutting portion 220.

In this case, when the first heat cutting portion 120 cuts a portion of the flexible substrate 50a by using Joule heat, the substrate protector 230 may cover a portion of the flexible substrate 50a located at the edge of the mounting surface 112a of the substrate supporting portion 110, so that the portion of the flexible substrate 50a located at the edge of the mounting surface 112a is prevented from being damaged. In other words, for example, the substrate protector 230 may absorb Joule heat emitted from the first heat cutting portion 120 so that a portion of the flexible substrate 50a located directly below the substrate protector 230 is effectively prevented from being affected by Joule heat.

Figure 12:
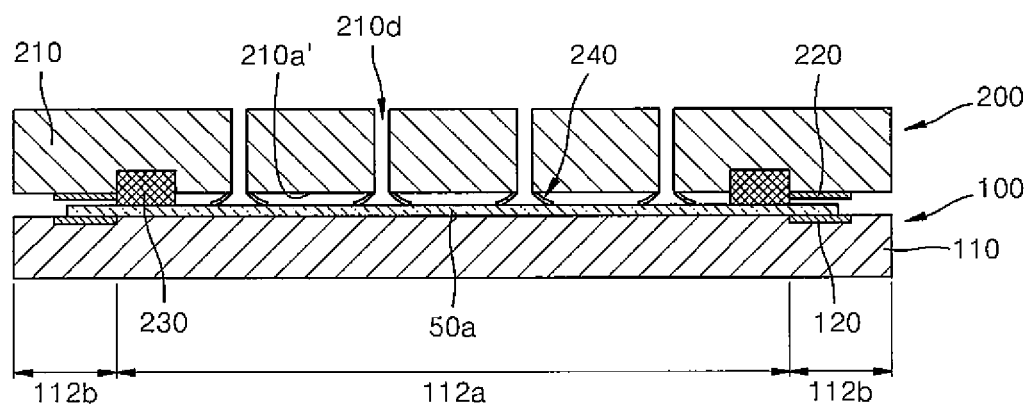
FIG. 12 is a cross-sectional view for describing a flexible substrate processing process using a substrate processing apparatus, according to another embodiment of the present invention.

FIG. 12 is a cross-sectional view for describing a flexible substrate processing process using a substrate processing apparatus, according to another embodiment of the present invention. In the substrate processing apparatus according to the current embodiment, the flexible substrate separating cover 200 includes a flexible substrate suction portion 240 on the accommodation surface of the cover body 210 or the plane 210a' including the accommodation surface. In FIG. 12, the flexible substrate suction portion 240 is included in the substrate processing apparatus of FIG. 11, but an embodiment of the present invention is not limited thereto. For example, a flexible substrate suction portion similar to the flexible substrate suction portion of FIG. 12 may be included in the substrate processing apparatuses of FIGS. 8 through 10 or a substrate processing apparatus according to a modified example.

When the portion of the flexible substrate 50a on the mounting surface 112a of the carrier 100 is separated from the remaining portion, and then detached from the carrier 100, the flexible substrate suction portion 240 may adhere through suction onto the portion of the flexible substrate 50a on the mounting surface 112a so that the flexible substrate 50a is easily detached from the carrier 100.

The flexible substrate suction portion 240 of the flexible substrate apparatus according to the current embodiment has elasticity, and thus may adhere through suction onto the flexible substrate 50a having any thickness or may adhere through suction onto a structure including the flexible substrate 50a without damaging the flexible substrate 50a or the structure. The flexible substrate suction portion 240 may be formed of a material, such as silicon or rubber.

Meanwhile, if required, a through hole 210*d* may be formed on the cover body 210 of the flexible substrate separating cover 200, and air or the like may be drawn out through the through hole 210*d*, thereby enabling the flexible substrate 50*a* to be adhered to and supported by the flexible substrate suction portion 240.

The carrier 100 or the substrate processing apparatus including the carrier 100 have already been described above, but an embodiment of the present invention is not limited thereto. For example, a method of manufacturing a flexible display apparatus using the carrier 100 or the substrate processing apparatus according to the above embodiments of the present invention is also within the scope of the invention.

For example, in a method of manufacturing a flexible display apparatus according to an embodiment of the present invention, the flexible substrate 50*a* may be disposed (e.g. formed, positioned, or placed) over any one of the mounting surface 112*a* and the outer circumferential surface 112*b* of the carrier 100, and then a current may flow through the first heat cutting portion 120 so that the portion of the flexible substrate 50*a* on the mounting surface 112*a* of the carrier 100 is separated from the remaining portion.

Accordingly, handling from among processes of the flexible substrate 50*a* may be stably performed, and the carrier 100 may be reused later.

Here, the disposing (e.g. forming, positioning, or placing) of the flexible substrate 50*a* may include coating polyimide over the mounting surface 112*a* and the outer circumferential surface 112*b* of the carrier 100, and at this time, a transparent flexible substrate may be formed.

Here, before separating the portion of the flexible substrate 50*a* on the mounting surface 112*a* from the remaining portion by flowing a current through the first heat cutting portion 120, a substrate processing process, such as forming and crystallizing an amorphous silicon layer on the flexible substrate 50*a* disposed on the carrier 100, may be performed.

Meanwhile, before disposing (e.g. forming, positioning, or placing) the flexible substrate 50*a* over the mounting surface 112*a* and the outer circumferential surface 112*b* of the carrier 100, the mounting surface 112*a* may be surface-processed. As described below, the portion of the flexible substrate 50*a* on the mounting surface 112*a* is a final flexible substrate. Accordingly, since the portion of the flexible substrate 50*a* on the mounting surface 112*a* is to be separated from the carrier 100 later, the mounting surface 112*a* may be surface-processed for easy separation.

The mounting surface 112*a* may be surface-processed by using any one of various methods, for example, a temporary bonding layer may be formed on the mounting surface 112*a*. In other words, before disposing (e.g. forming, positioning, or placing) the flexible substrate 50*a* over the mounting surface 112*a* and the outer circumferential surface 112*b* of the carrier 100, a temporary bonding layer may be formed on the mounting surface 112*a* by using a material, such as polysiloxane. Here, polysiloxane is a material having a weak binding force with respect to a flexible substrate formed of, for example, polyimide, and any material other than polysiloxane, which has a weak binding force with respect to a flexible substrate may be used.

When the mounting surface 112*a* is surface-processed and then the flexible substrate material is coated and hardened over the mounting surface 112*a* and the outer circumferential surface 112*b*, the portion of the flexible substrate 50*a* corresponding to the mounting surface 112*a* is temporarily bonded to the mounting surface 112*a*, and the portion of the flexible substrate 50*a* corresponding to the outer circumferential surface 112*b* is permanently bonded to the outer circumferential surface 112*b*. Since the portion of the flexible substrate 50*a* corresponding to the outer circumferential surface 112*b* is permanently bonded to the outer circumferential surface 112*b*, the flexible substrate 50*a* is fixed on the carrier 100, and thus handling stability of the flexible substrate 50*a* may be obtained.

Here, the portion of the flexible substrate 50*a* on the outer circumferential surface 112*b* may be removed later by using a physical method, or by using the first heat cutting portion 120 as described above with reference to FIGS. 6 and 7, and thus reusing of the carrier 100 may be assured.

According to one or more embodiments of the present invention described above, a carrier for a flexible substrate, which enables a flexible substrate to be easily handled during a manufacturing process of a flexible display apparatus and to be easily separated, a substrate processing apparatus including the carrier, and a method of manufacturing a flexible display apparatus, may be realized. It will be understood that the scope of the invention is not limited by these effects.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A method of manufacturing a flexible display apparatus, the method comprising:
  preparing a carrier for a flexible substrate, wherein the carrier comprises a substrate supporting portion having a top surface comprising
    a mounting surface,
    an outer circumferential surface surrounding the mounting surface, and
    a first heat cutting portion located outside the mounting surface so as to be exposed on the top surface, the first heat cutting portion being configured to generate heat when a current flows through the first heat cutting portion;
  disposing the flexible substrate over the mounting surface and the outer circumferential surface; and
  separating a portion of the flexible substrate from a remaining portion by using heat generated in the first heat cutting portion.

2. The method of claim 1, wherein the disposing of the flexible substrate comprises coating polyimide over the mounting surface and the outer circumferential surface.

3. The method of claim 2, wherein the disposing of the flexible substrate comprises forming the flexible substrate by coating polyimide over the mounting surface and the outer circumferential surface.

4. The method of claim 1, further comprising forming and crystallizing an amorphous silicon layer on the flexible substrate.

5. The method of claim 1, wherein
  the top surface is flat throughout the mounting surface and the outer circumferential surface and
  the first heat cutting portion comprises a thin film line.

6. The method of claim 1, wherein
  the substrate supporting portion has a groove in a portion of the outer circumferential surface near the mounting surface and
  the first heat cutting portion is located in the groove so as to be exposed on the top surface.

7. The method of claim 1, wherein the first heat cutting portion surrounds the mounting surface such that a portion of the mounting surface is opened.

8. The method of claim 7, wherein an electric connection terminal is located at each end of the first heat cutting portion.

9. The method of claim 1, wherein the first heat cutting portion comprises molybdenum disilicide.

10. The method of claim 1, wherein the substrate supporting portion comprises glass-ceramic.

* * * * *